United States Patent
Chen

(10) Patent No.: US 10,690,333 B2
(45) Date of Patent: Jun. 23, 2020

(54) HEAT DISSIPATING FRAME STRUCTURE AND FABRICATING METHOD THEREOF

(71) Applicant: Mentor Technologies Co., Ltd., New Taipei (TW)

(72) Inventor: Li Fu Chen, New Taipei (TW)

(73) Assignee: MENTOR TECHNOLOGIES CO., LTD., New Taipei (TW)

( * ) Notice: Subject to any disclaimer, the term of this patent is extended or adjusted under 35 U.S.C. 154(b) by 848 days.

(21) Appl. No.: 15/208,803

(22) Filed: Jul. 13, 2016

(65) Prior Publication Data

US 2017/0059146 A1 Mar. 2, 2017

(30) Foreign Application Priority Data

Aug. 27, 2015 (TW) .............................. 104128119 A

(51) Int. Cl.
*F21V 29/70* (2015.01)
*H01L 33/62* (2010.01)
*H01L 33/64* (2010.01)
*F21V 29/89* (2015.01)
*B23P 15/26* (2006.01)
(Continued)

(52) U.S. Cl.
CPC .............. *F21V 29/70* (2015.01); *B23P 15/26* (2013.01); *F21V 29/89* (2015.01); *H01L 33/62* (2013.01); *H01L 33/647* (2013.01); *F21Y 2115/10* (2016.08); *H01L 33/483* (2013.01); *H01L 2933/0075* (2013.01)

(58) Field of Classification Search
CPC ..... H01L 33/62; H01L 33/483; H01L 33/641; H01L 33/642; H01L 33/647; H01L 2933/0075; F21V 29/70
See application file for complete search history.

(56) References Cited

U.S. PATENT DOCUMENTS

| | | | |
|---|---|---|---|
| 6,552,368 B2 * | 4/2003 | Tamai | H01L 33/60 257/100 |
| 6,858,869 B2 * | 2/2005 | Fujiwara | H01L 33/504 257/103 |

(Continued)

FOREIGN PATENT DOCUMENTS

| | | |
|---|---|---|
| CN | 201408782 Y | 2/2010 |
| CN | 203932098 U | 11/2014 |

(Continued)

OTHER PUBLICATIONS

Office Action dated Dec. 24, 2015 in corresponding Taiwanese application (Search Report included), English translation provided, 8 pages total.

(Continued)

*Primary Examiner* — Jianying C Atkisson
*Assistant Examiner* — Jose O Class-Quinones
(74) *Attorney, Agent, or Firm* — Bacon & Thomas, PLLC

(57) ABSTRACT

Disclosed are a heat dissipating frame structure having higher heat dissipation efficiency than the prior arts and a fabricating method thereof. Namely, the heat dissipating frame structure comprises a metal plate assembly, a part of which contacting with a heating element, and a plastic composition combined with the metal plate assembly to through the metal plate assembly receive the heat generated from the heating element.

6 Claims, 9 Drawing Sheets

(51) Int. Cl.
*H01L 33/48* (2010.01)
*F21Y 115/10* (2016.01)

(56) References Cited

U.S. PATENT DOCUMENTS

| | | | | |
|---|---|---|---|---|
| 7,531,844 | B2* | 5/2009 | Matsumoto | H01L 33/60 257/433 |
| 7,919,788 | B2* | 4/2011 | Wu | H01L 33/483 257/99 |
| 2008/0251805 | A1* | 10/2008 | Lin | H01L 33/642 257/98 |
| 2009/0231848 | A1* | 9/2009 | Huang | F21K 9/00 362/249.01 |
| 2014/0021501 | A1* | 1/2014 | Chen | H01L 33/44 257/98 |
| 2014/0203321 | A1* | 7/2014 | Seo | H01L 33/642 257/98 |

FOREIGN PATENT DOCUMENTS

| | | | |
|---|---|---|---|
| EP | 2672535 | A2 | 12/2013 |
| JP | S60-86878 | A | 5/1985 |
| JP | 2000-183406 | A | 6/2000 |
| TW | M448624 | U1 | 3/2013 |

OTHER PUBLICATIONS

Search opinion dated Jan. 17, 2017 in corresponding European application EP 16183026.
Search report dated Jan. 17, 2017 in corresponding European application EP 16183026.

\* cited by examiner

HEAT DISSIPATING FRAME STRUCTURE AND FABRICATING METHOD THEREOF

TECHNICAL FIELD

The present disclosure relates to a heat dissipating frame structure and a fabricating method thereof.

BACKGROUND

Aspect of light emitting diode (LED) package structures, there already exists a frame type package in which high power light emitting diode dies are put into a base for being packaged, and the packaged high power light emitting diode is further welded onto a aluminum board for basic heat dissipation, and then a heat sink and the high power light emitting diode with the aluminum board are combined. Regarding such frame type package, light emitting diode dies are in advance packaged on a high power base, and the package is arranged to be contacted with the surface of a copper foil through conductive paste and then through a FR4 (epoxy resin fiberglass) aluminum board to dissipate heat by the combination of the conductive paste and the heat dissipation board.

Here, the volume of such frame type package is typically small so that generally a 1~3 W product is in advance packaged and then put to use in higher wattage products with the arrangement of the aluminum board. In the case of the light board of 7 watts and an aluminum extrusion cylinder of 50 mm*30 mm being used as the heat sink, it is discovered that obvious decline and dim brightness occurred on the light emitting diodes when the temperature of the heat sink is up to 70 degrees Celsius and thus the heat dissipation efficiency decreases.

As to the technique for higher heat dissipation efficiency, in recent years a COB (Chip On Board) package different from the conventional frame type package has been developed, in which more than one LED dies are directly packaged on a aluminum board and then the aluminum board and a heat sink are combined for heat dissipation.

As for such COB package, in the case of the light board of 7 watts and an aluminum extrusion cylinder of 50 mm*30 mm being used as the heat sink, the upper temperature limit is 75 degrees Celsius, but there is still room for improving the heat dissipation efficiency.

SUMMARY

The purpose of the present disclosure is to provide a heat dissipating frame structure and a fabricating method thereof for effectively and rapidly exporting the thermal energy generated from the working of heating elements such as high power light emitting diodes, so that the performance can be better, the life can be longer, the size can be smaller and thus the breadth of the applications can be enhanced and therefore the ease of use is increased.

To achieve the object as described above, one aspect of the present disclosure is a heat dissipating frame structure comprising: a metal plate assembly, a part of which contacting with a heating element; and a plastic composition combined with the metal plate assembly to through the metal plate assembly receive the heat generated from the heating element.

Accordingly, by the combination of the thermal conductivity of the metal plate assembly and the plastic composition, in addition to the excellent heat dissipation efficiency, the merits with respect to the appearances, weights, prices, volumes etc. acquired by using the plastic composition can be reflected. Further, other heat dissipation means can be additionally combined as appropriate.

Further, according to the heat dissipating frame structure of one aspect of the present disclosure, the combination of the metal plate assembly and the plastic composition is accomplished by at least insert moulding.

Accordingly, the metal plate assembly and the plastic composition can be closely combined so that the metal plate assembly and the plastic composition completely contact with each other as the heat therebetween is conducted without a medium; thus, the heat conduction can be quick, and the heat dissipation can have the best efficiency.

In addition, according to the heat dissipating frame structure of one aspect of the present disclosure, the insert moulding is executed in a mould having a fixing means.

Accordingly, the combination of the metal plate assembly and the plastic composition is accomplished in the mould having the fixing means so that for example deformations and displacements of the metal plate assembly, causing the inequality of the heat conduction and the decrease of the heat dissipation efficiency, caused by the excessive pressure during the insert moulding can be prevented. Further, other means such as a heat dissipation means for conducting the heat can be added in to the mould as appropriate.

Moreover, according to the heat dissipating frame structure of one aspect of the present disclosure, the metal plate assembly includes a first metal plate partially contacting with the heating element and a second metal plate connecting with the heating element.

Accordingly, the metal plate assembly is arranged to include at least two metal plates so that the positive and negative polarities can be separated to prevent short circuit, and the heating elements such as LED dies can be directly placed on the metal plate for heat conduction, and it can be further used directly as the plug of a external power supply; thus, various functions are achieved at the same time so that the breadth of the applications is increased. Further, the number of the heat sink can be changed as appropriate.

Further, according to the heat dissipating frame structure of one aspect of the present disclosure, the first metal plate includes a part contacting with the heating element, a surrounding portion and a first electrode portion.

Accordingly, various functions can be achieved by one metal plate so that the volume can be further reduced and the breadth of applying the heat dissipating frame structure can be increased significantly. Further, the first metal plate is not limited to include the part contacting with the heating element, the surrounding portion and the first electrode portion and can be formed to include other parts as appropriate.

In addition, according to the heat dissipating frame structure of one aspect of the present disclosure, the surrounding portion of the first metal plate is formed by folding an elongated metal plate into which the two terminals in the long side direction overlap and the shape is circular viewing from the short side direction, and fixing the overlapped portion.

Accordingly, the shape of the first metal plate becomes the shape with which the heat can be conducted uniformly; in addition, the overlapped portions are fixed so that the first metal plate is difficult to be affected by the excessive pressure during the insert moulding to avoid the deformation. Further, as long as the heat can be conducted uniformly, the shape and the fixing method can be changed as appropriate.

Moreover, according to the heat dissipating frame structure of one aspect of the present disclosure, the second metal plate is L shaped and includes a second electrode portion and a part perpendicular to the second electrode portion and being connecting with the heating element, the in-plane direction of the part of the second metal plate connecting with the heating element being parallel to the in-plane direction of the part of the first metal plate contacting with the heating element, the second electrode portion of the second metal plate being surrounded by the surrounding portion of the first metal plate.

Accordingly, the second metal plate can be for example served as the plug of the external power supply during the product application and at the same time assist in conducting the heat generated from the heating element rapidly to the plastic composition. Certainly, the shape of the second metal plate can be changed and various parts can be added as appropriated to provide more functions.

Further, according to the heat dissipating frame structure of one aspect of the present disclosure, the plastic composition is formed to include fixing grooves.

Accordingly, other means can be combined with the fixing grooves or the fixing holes to further expand the functions. Further, the outer shape of the plastic composition can be designed as appropriate and is not limited to form the fixing grooves or the fixing holes.

DETAILED DESCRIPTION

Hereinafter, an exemplary embodiment of the present disclosure is described with reference to the drawings.

Figure 1:
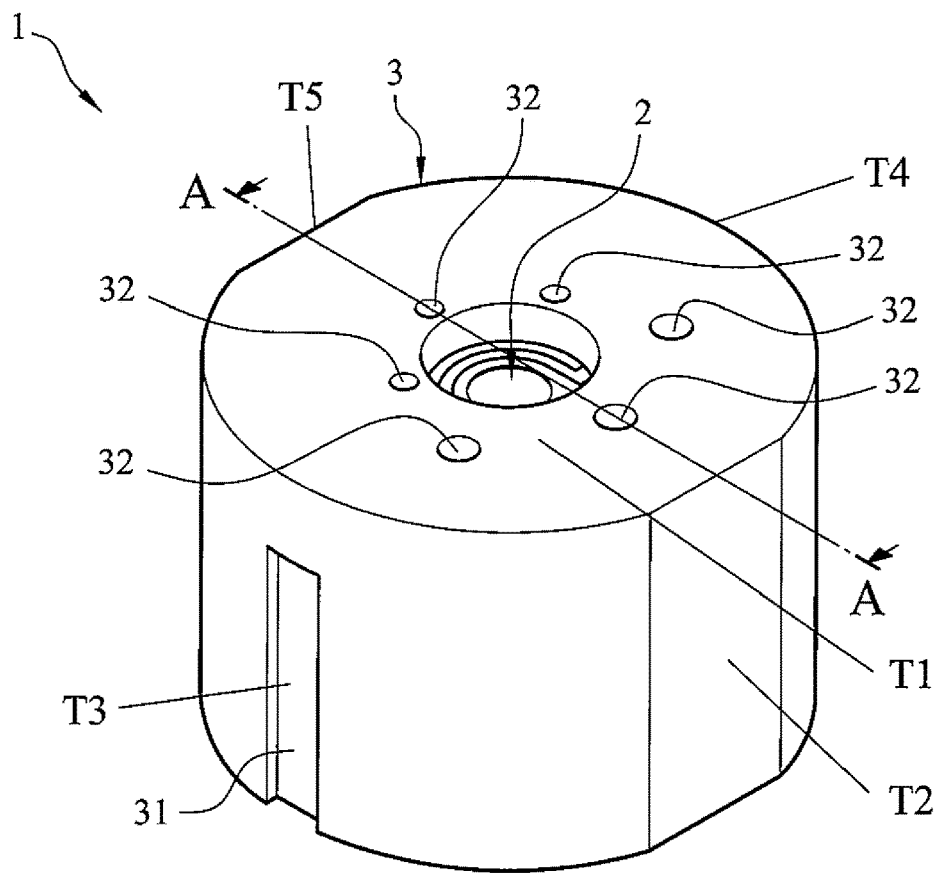
FIG. 1 is a perspective view of a heat dissipating frame structure according to an exemplary embodiment of the present disclosure.

FIG. 1 is a perspective view of the heat dissipating frame structure 1 according to an exemplary embodiment of the present disclosure.

As illustrated in FIG. 1, the heat dissipating frame structure 1 includes a metal plate assembly 2 and a plastic composition 3 covering the metal plate assembly 2. Here, the plastic composition 3 partially covers the metal plate assembly 2 so that the top surface of the metal plate assembly 2 is exposed for directly contacting with heating elements such as LED dies (bare dies) to conduct rapidly the heat generated from the heating elements such as LED dies to the whole metal plate assembly.

The material of the metal plate assembly 2 can be any metal having excellent thermal conductivity, such as silver, copper, gold, aluminum, tungsten etc., and an alloy of the metals having excellent thermal conductivity. As the thermal conductivity of copper is better than gold, aluminum and tungsten and the price of copper is lower than silver, the material of the metal plate assembly is preferably copper. In the case of copper, the thermal conductivity is for substantially 390~401 W/mK.

The plastic composition 3 can include any material having excellent thermal conductivity such as approximately 11 W/mK. According to an exemplary embodiment of the present disclosure, the plastic composition 3 for example includes polycarbonate plastic and carbon black (black lead) composite etc.

According to an exemplary embodiment of the present disclosure, the heat dissipation of the heating elements such as LED dies is accomplished by the combination of the metal plate assembly 2 and the plastic composition 3, as the effect of thermal conduction of the metal plate assembly 2 with the plastic composition 3 form a complete heat dissipation frame, the plastic composition 3 being better than the metals in the variability of appearances, weights, prices and volumes so that the breadth of the applications of the heat dissipating frame structure 1 can be increased by combining both without impairing the heat dissipation property.

Further, in the same figure, the plastic composition 3 is formed to include the fixing grooves 31 and the fixing holes 32. The fixing grooves 31, in addition to having the fixing function by means of the combination with other fixing members, are also used for further conducting the heat generated from the heating elements such as LED dies by for example contacting with other metal members to increase the heat dissipation efficiency. The fixing holes 32 can be used as for example the fixing holes for installing a light cover and similar to the fixing grooves 31 can be used for further conducting the heat generated from the heating elements such as LED dies by for example contacting with other metal members to increase the heat dissipation efficiency.

Hereinafter, further increasing the heat dissipation efficiency by means of the combinations of the fixing grooves 31, the fixing holes 32 and other means is described with reference to FIG. 1, FIG. 2, FIG. 3A, FIG. 3B, FIG. 3C and FIG. 3D.

Figure 2:
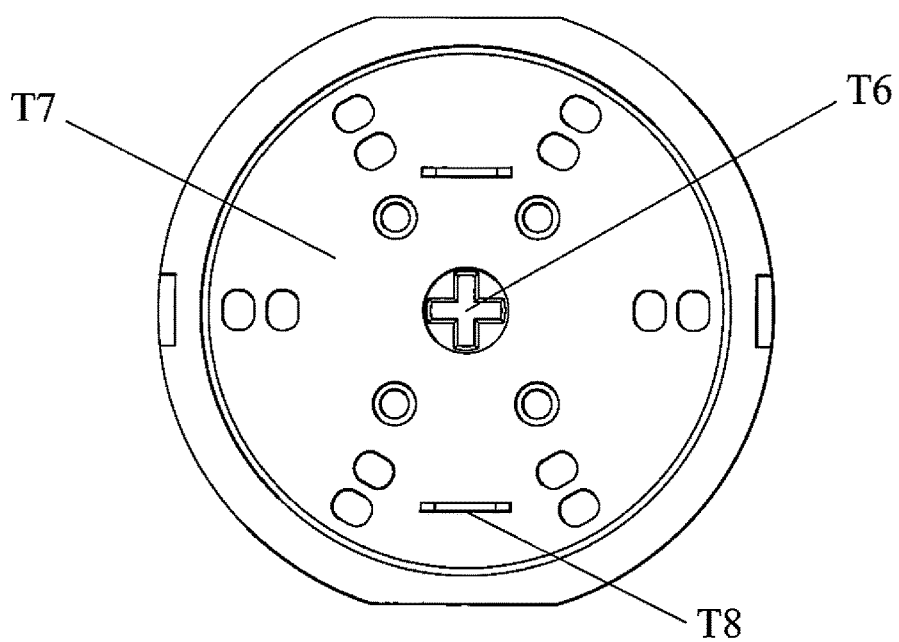
FIG. 2 is a bottom view of a heat dissipating frame structure according to an exemplary embodiment of the present disclosure.

FIG. 2 is a bottom view of the heat dissipating frame structure 1 according to an exemplary embodiment of the present disclosure. FIG. 3A, FIG. 3B, FIG. 3C and FIG. 3D are schematic views of the combinations of the heat dissipating frame structures and other means for heat dissipation according to an exemplary embodiment of the present disclosure.

As illustrated in FIGS. 1 and 2, a plurality of temperature test points T1, T2, T3, T4, T5, T6, T7 and T8 is set on the heat dissipating frame structure 1. Wherein, the temperature test point T1 is set on the top surface of the heat dissipating frame structure 1, and the temperature test points T2, T3, T4 and T5 are set on the side surface of the heat dissipating frame structure 1. Moreover, the temperature test points T2 faces to T5, and the temperature test points T3 faces to T4, the temperature test points T6, T7 and T8 are set on the surface, of the heat dissipating frame structure 1, opposite to the surface on which the fixing grooves 31 and fixing holes 32 are arranged. The test results and parameters are shown in Table 1.

TABLE 1

| Samples tested: #1 (white light) | | | | | |
|---|---|---|---|---|---|
| S/N | T1 | T2 | T3 | T4 | ambient temperatures | driving currents |
| #1 | 85.2 | 74.4 | 73.8 | 74.2 | 23.3 | 700 mA |
|  | 100.3 | 86.6 | 87.2 | 86.5 | 24.7 | 800 mA |
|  | 111.6 | 95.8 | 96.5 | 95.3 | 25.2 | 900 mA |
|  | 115.9 | 98.4 | 98.4 | 97.3 | 24.3 | 1000 mA |
|  | 126.1 | 106.6 | 103.5 | 103.9 | 23.7 | 1100 mA |
|  | 134.4 | 114.4 | 111.2 | 111.7 | 23.4 | 1200 mA |
| S/N | T5 | T6 | T7 | T8 | ambient temperatures | driving currents |
| #1 | 76.3 | 94.1 | 83.4 | 79.8 | 23.3 | 700 mA |
|  | 88.4 | 111.2 | 97.4 | 91.9 | 24.7 | 800 mA |
|  | 97.3 | 125.0 | 107.9 | 101.3 | 25.2 | 900 mA |
|  | 100.0 | 130.8 | 111.2 | 102.4 | 24.3 | 1000 mA |
|  | 108.2 | 144.9 | 115.7 | 105.7 | 23.7 | 1100 mA |
|  | 116.5 | 155.4 | 124.1 | 113.8 | 23.4 | 1200 mA | unit: degrees Celsius

As shown in Table 1, when the power consumption is 6.753 W with 700 mA, the temperature measured at the temperature test point T6 is 94.1 degrees Celsius, the temperature measured at the temperature test point T1 is 85.2 degrees Celsius, and the temperature measured at the temperature test point T5 is 76.3 degrees Celsius. When the power consumption is 7.92 W with 800 mA, the temperature measured at the temperature test point T6 is 111.2 degrees Celsius, the temperature measured at the temperature test point T1 is 100.3 degrees Celsius, and the temperature measured at the temperature test point T5 is 88.4 degrees Celsius. When the power consumption is 9.146 W with 900 mA, the temperature measured at the temperature test point T6 is 125 degrees Celsius, the temperature measured at the temperature test point T1 is 111.6 degrees Celsius, and the temperature measured at the temperature test point T5 is 97.3 degrees Celsius. When the power consumption is 10.597 W with 1000 mA, the temperature measured at the temperature test point T6 is 130.8 degrees Celsius, the temperature measured at the temperature test point T1 is 115.9 degrees Celsius, and the temperature measured at the temperature test point T5 is 100 degrees Celsius.

Figure 3A:
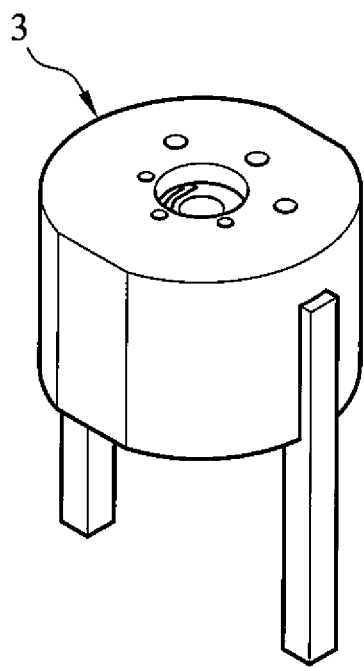
FIG. 3A, FIG. 3B, FIG. 3C and FIG. 3D are schematic views of combinations of heat dissipating frame structures and other means for heat dissipation according to an exemplary embodiment of the present disclosure.

Next, as illustrated in FIG. 3A, with two square aluminum columns of 5 mm*3.5 mm*47 mm inserted into the fixing grooves 31 and in case of the power consumption being 9.146 W with 900 mA, the temperature measured at the temperature test point T6 is 113.7 degrees Celsius, the temperature measured at the temperature test point T1 is 106.7 degrees Celsius, the temperature measured at the temperature test point T5 is 84.7 degrees Celsius, and the temperatures obviously decreased.

Figure 3B:
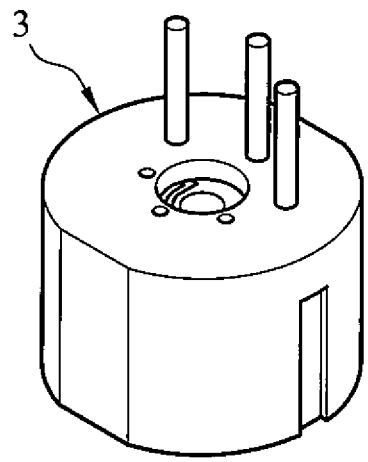

Moreover, as illustrated in FIG. 3B, with three circular aluminum columns of 45 mm*3 mm inserted into the fixing holes 32 and in case of the power consumption being 9.146 W with 900 mA, the temperature measured at the temperature test point T6 is 111.8 degrees Celsius, the temperature measured at the temperature test point T1 is 97.3 degrees Celsius, the temperature measured at the temperature test point T5 is 82.3 degrees Celsius, and the temperatures obviously decreased as well.

Figure 3C:
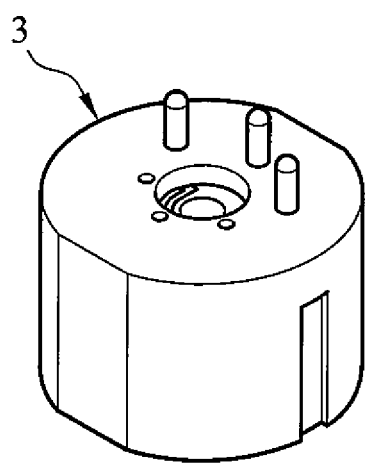

In addition, as illustrated in FIG. 3C, three circular aluminum columns of 15 mm*3 mm inserted into the fixing holes 32 and in the case of the power consumption being 9.146 W with 900 mA, the temperature measured at the temperature test point T6 is 113.7 degrees Celsius, the temperature measured at the temperature test point T1 is 106.1 degrees Celsius, the temperature measured at the temperature test point T5 is 86.3 degrees Celsius, and the temperatures obviously decreased as well.

Figure 3D:
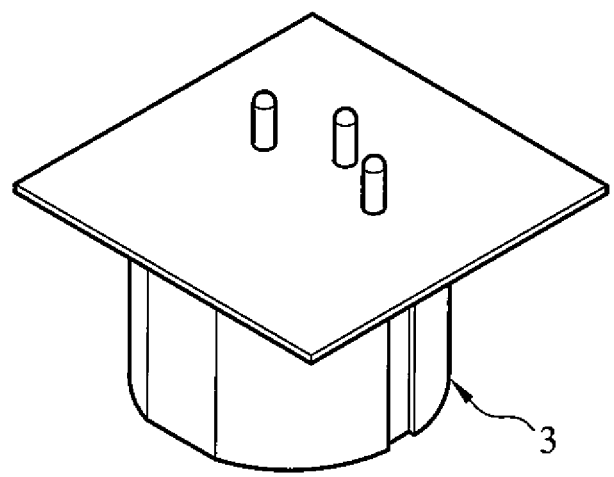

Moreover, as illustrated in FIG. 3D, with three circular aluminum columns of 15 mm*3 mm inserted into the fixing holes 32 and an aluminum sheet of 60 mm*60 mm*0.2 mm further added and in the case of the power consumption being 9.146 W with 900 mA, the temperature measured at the temperature test point T6 is 109.2 degrees Celsius, the temperature measured at the temperature test point T1 is 99 degrees Celsius, the temperature measured at the temperature test point T5 is 81 degrees Celsius, and the temperatures obviously decreased.

Thus, it is known that the fixing grooves 31 and fixing holes 32 can be used for further conducting the heat generated from the heating elements such as LED dies by for example contacting with other metal member to increase the heat dissipation efficiency.

According to an exemplary embodiment of the present disclosure, the plastic composition 3 formed to include the fixing grooves 31 and the fixing holes 32; however, the profile of the composition 3 can be designed as appropriated and is not limited thereto.

Hereinafter, the metal plate assembly 2 according to an exemplary embodiment of the present disclosure is further described with reference to FIGS. 4 and 5.

Figure 4:
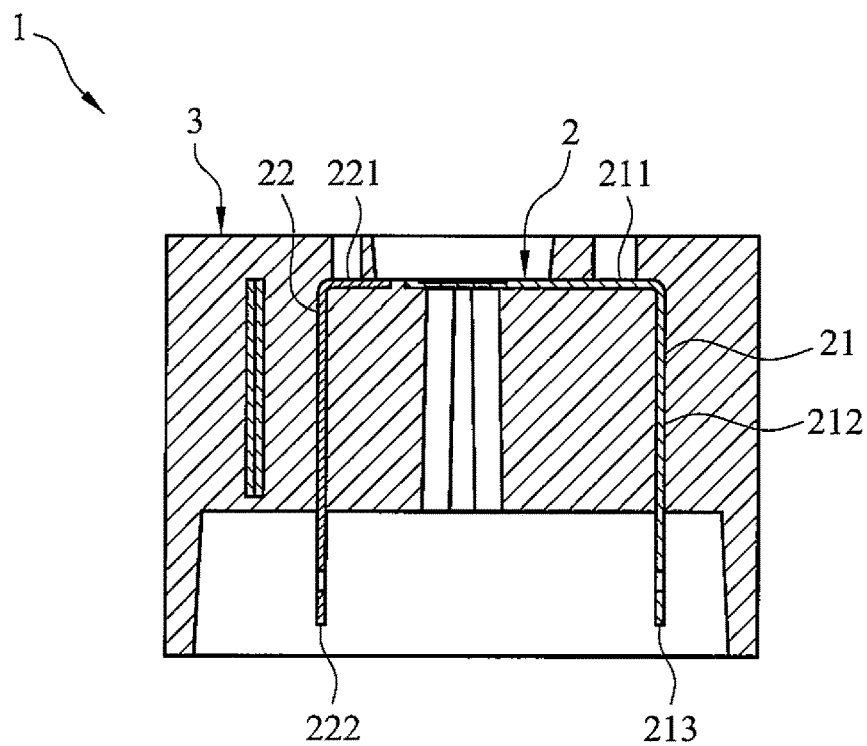
FIG. 4 is a cross-sectional view along A-A line in FIG. 1.

FIG. 4 is a cross-sectional view along A-A line in FIG. 1.
FIG. 5 is a perspective view of the metal plate assembly 2 according to an exemplary embodiment of the present disclosure.

Figure 5:
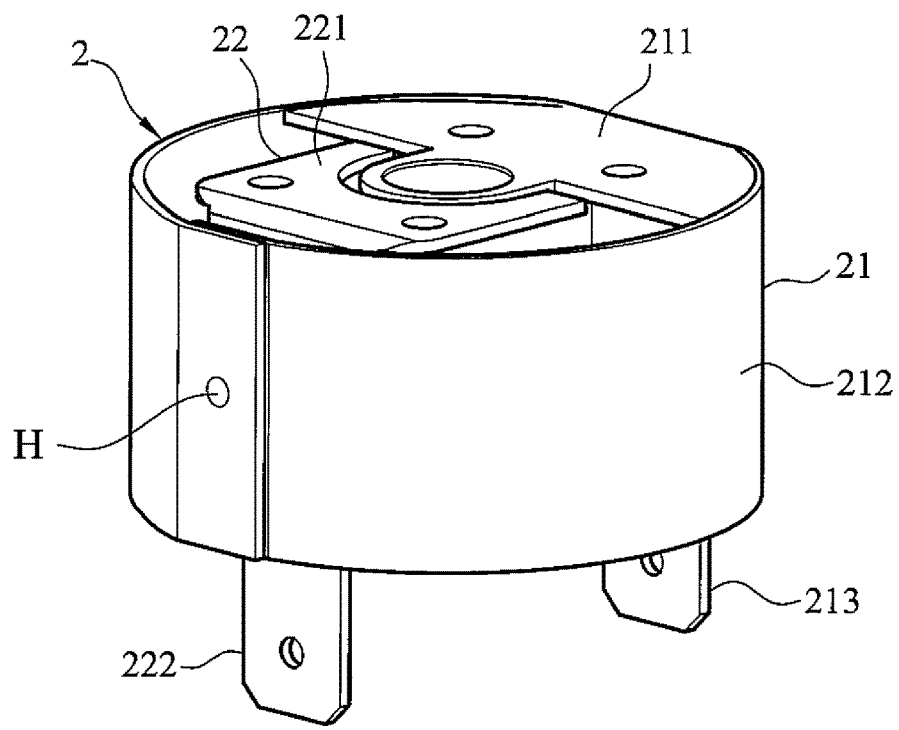
FIG. 5 is a perspective view of a metal plate assembly according to an exemplary embodiment of the present disclosure.

As illustrated in FIGS. 4 and 5, the metal plate assembly 2 according an exemplary embodiment of the present disclosure includes the first metal plate 21 and second metal plate 22. The first metal plate 21 and the second metal plate 22 are respectively formed to have different shapes so that the same or various functions are provided respectively as appropriate.

Specifically, as illustrated in FIGS. 4 and 5, the first metal plate 21 includes the part 211 for directly contacting with the heating elements such as LED dies, the surrounding portion 212 for conducting the heat uniformly, and the first electrode portion 213. Further, as illustrated in FIG. 5, the two terminals of the surrounding portion 212 are respectively formed to have the connecting holes H. Regarding the connecting holes H, further descriptions are provided below.

Further, as illustrated in FIG. 4, the second metal plate 22 is L shaped and includes the second electrode portion 222 and the part 221 perpendicular to the second electrode portion 222 and connecting with the heating elements such as LED dies.

As mentioned previously, if a single metal plate is used, it returns to the conventional application, in which the LEDs are formed onto an aluminum board, and then it is locked on a single metal plate; moreover, the positive and the negative polarity shall be bonded additionally with wires to external power supplies as the single metal plate is electrically conducted and short circuit occurs if the positive and negative power supplies are connected.

Thus, according to an exemplary embodiment of the present disclosure, the metal plate assembly 2 includes at least two metal plates, that is, the first metal plate 21 and second metal plate 22 so that for example the positive and negative polarities can be separated to prevent short circuit and heating elements such as LED dies can be directly placed on the first metal plate 21 for heat conduction and the second metal plate 22 can be for example served as the plug of the external power supply during the product application and at the same time assist in conducting the heat generated from the heating element rapidly to the plastic composition; accordingly, various functions are achieved at the same time and the breadth of the applications is increased.

Figure 6:
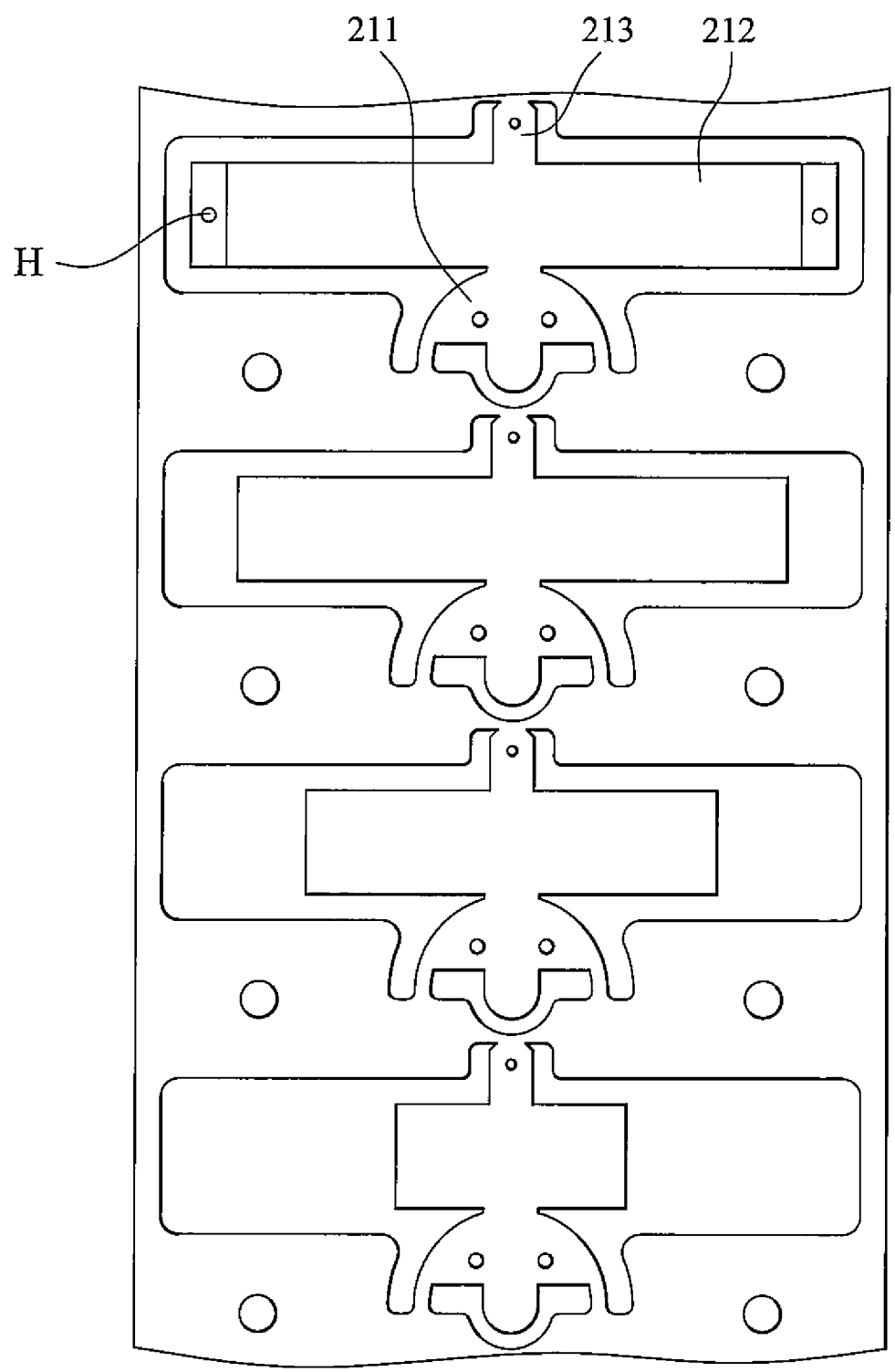
FIG. 6 is a plan schematic view of a bending process of first metal plates according to an exemplary embodiment of the present disclosure.
Figure 7:
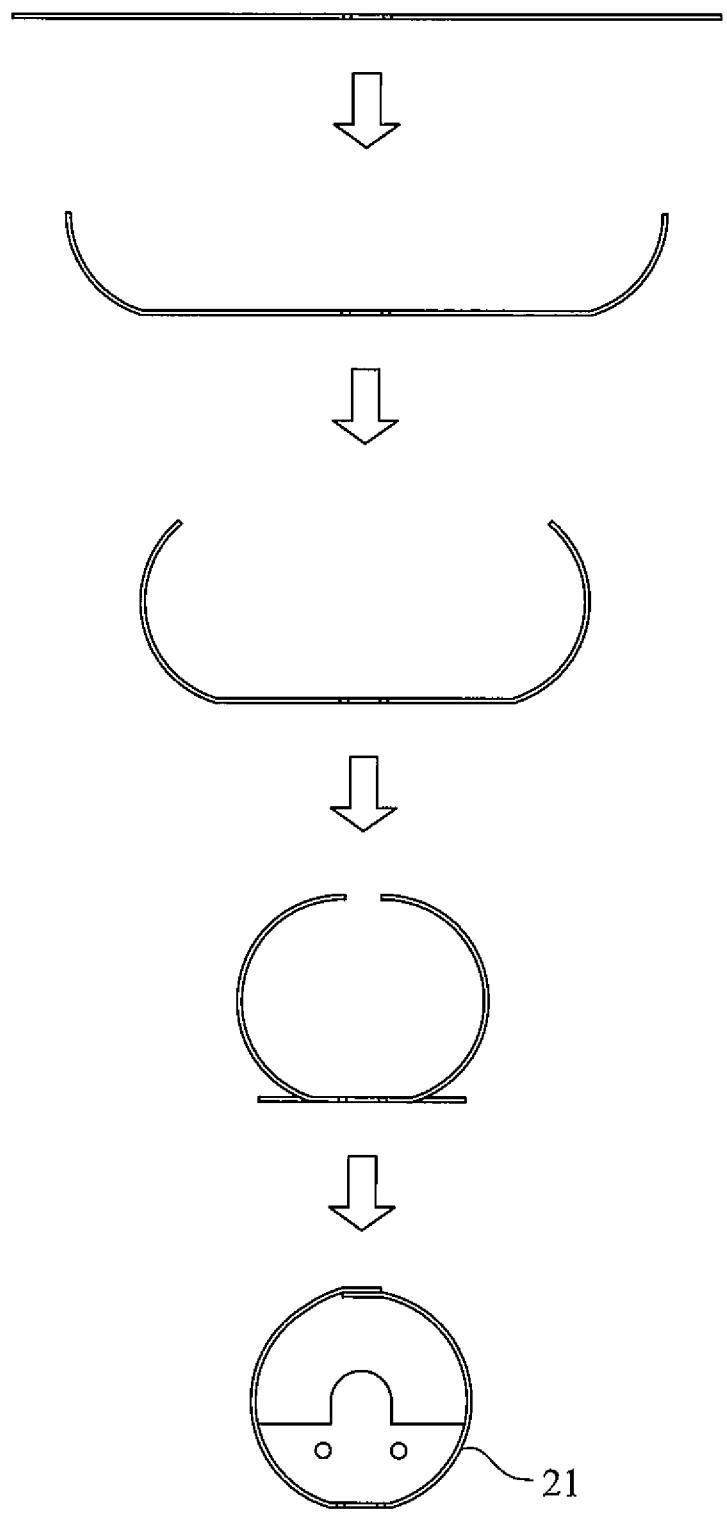
FIG. 7 is a schematic view of a bending process of a single first metal plate according to an exemplary embodiment of the present disclosure.
Figure 8:
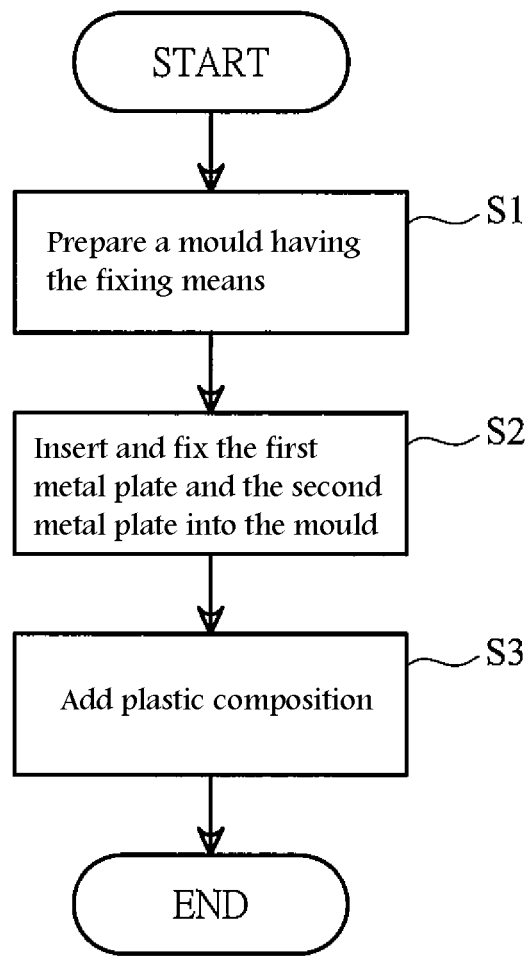
FIG. 8 is a flow chart illustrating a fabrication of a heat dissipating frame structure according to an exemplary embodiment of the present disclosure.
Figure 9A:
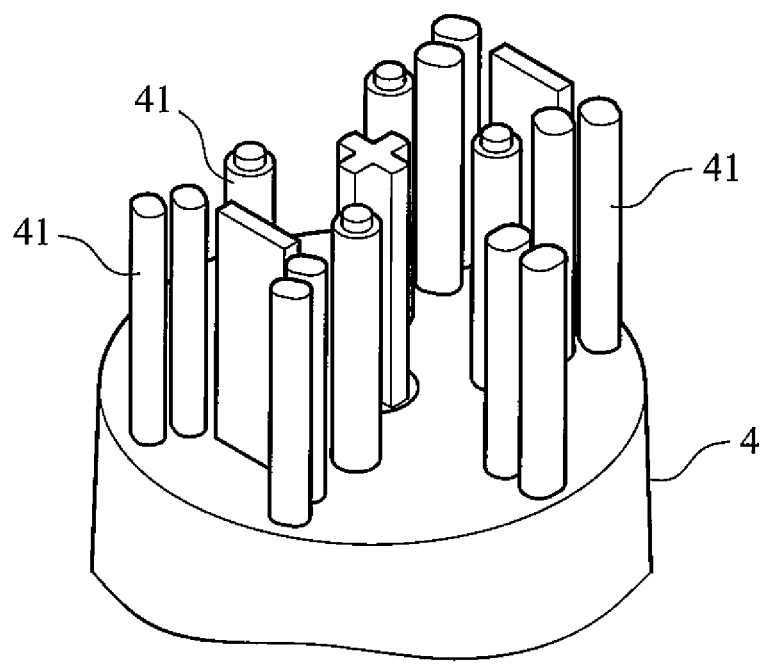
FIGS. 9A and 9B are top views illustrating a combination of a mould and a metal plate assembly according to an exemplary embodiment of the present disclosure.
Figure 9B:
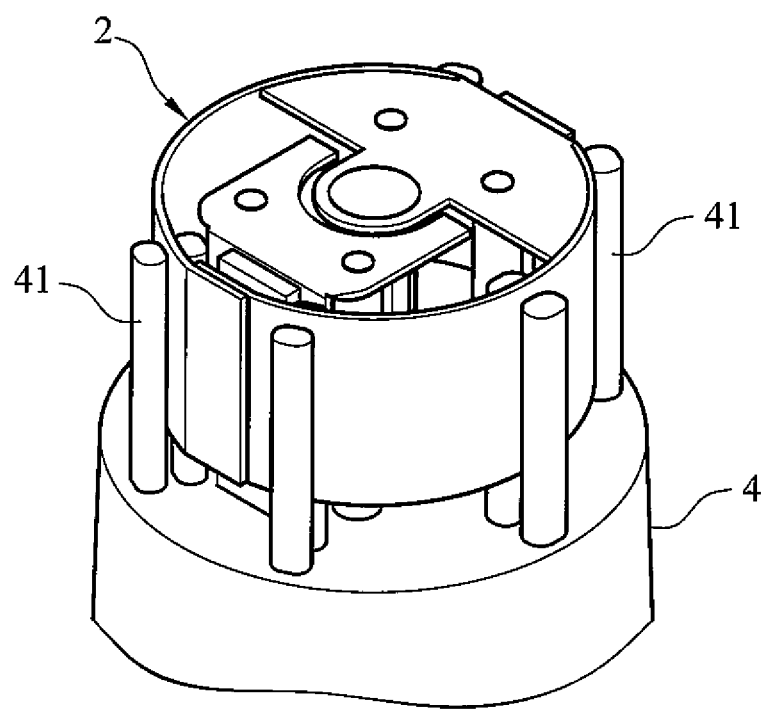
Figure 10:
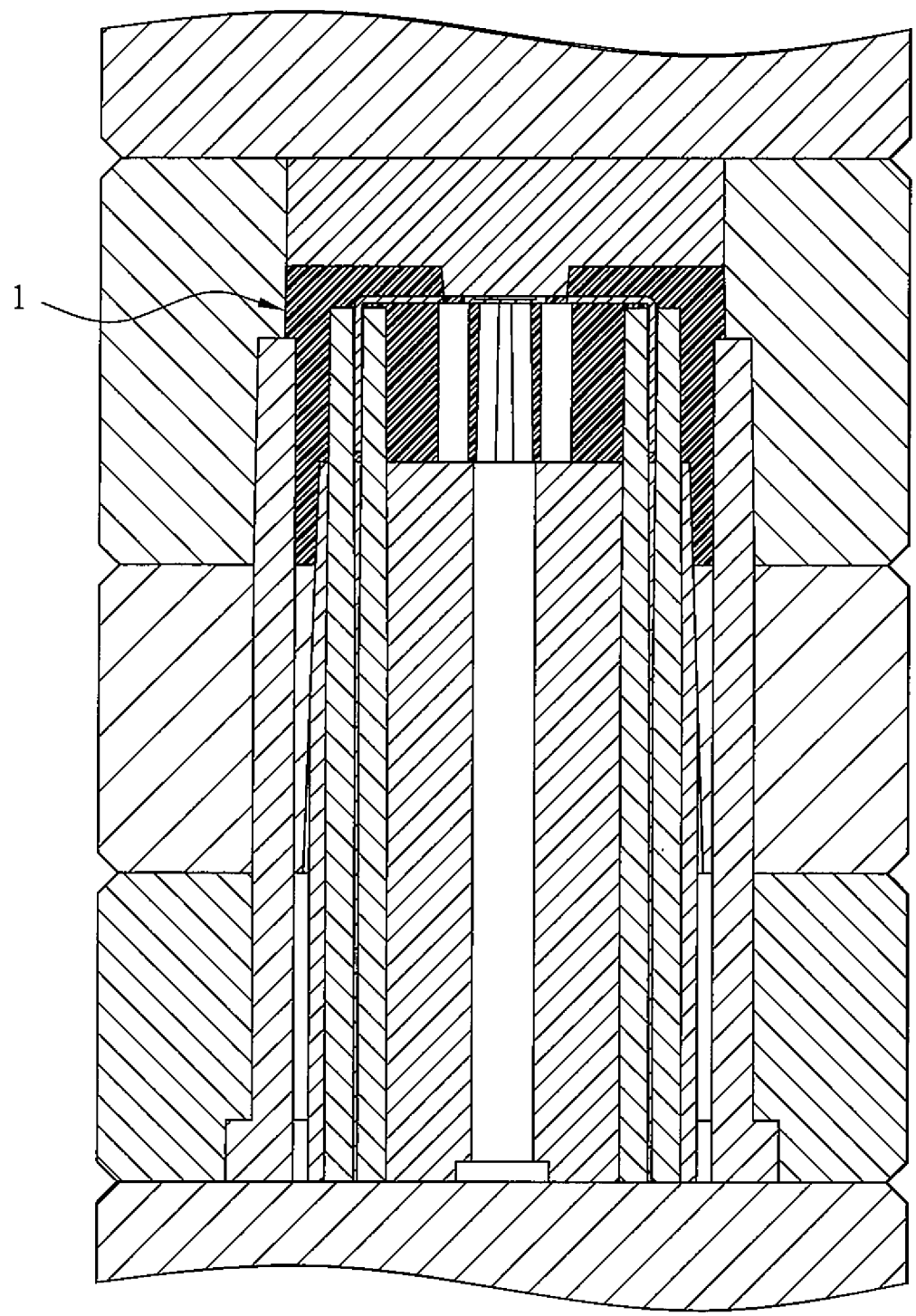
FIG. 10 is a cross-sectional view illustrating a implement for insert moulding according to an exemplary embodiment of the present disclosure.

Hereinafter, the process for fabricating the heat dissipating frame structure 1 is described with reference to FIGS. 6~10. FIG. 6 is a plan schematic view of the bending process of the first metal plates 21 according to an exemplary embodiment of the present disclosure. FIG. 7 is a schematic view of the bending process of the single first metal plate 21 according to an exemplary embodiment of the present disclosure. FIG. 8 is a flow chart illustrating the fabrication of the heat dissipating frame structure 1 according to an exemplary embodiment of the present disclosure. FIGS. 9A and 9B are top views illustrating the combination of the mould 4 and the metal plate assembly 2 according to an exemplary embodiment of the present disclosure. FIG. 10 is a cross-sectional view illustrating the implement for insert moulding according to an exemplary embodiment of the present disclosure.

First, a plurality of first metal plates 21 is formed as the one illustrated on the top of FIGS. 6 and 7 through a jig process, nickel plating, selective gold plating, cutting and stamping in sequence. Next, as shown by the second one to the forth one illustrated in FIGS. 6 and 7, arc folding, bending and rounding are executed in sequence to form the shape of substantially surrounding viewing from the short side direction, and the two holes illustrated in FIG. 6 overlap. Finally, the connecting holes H of the overlapped portions are fixed by rivets.

Further, the second metal plate 22 is formed as the one illustrated in FIGS. 4 and 5 through a jig process, nickel plating, gold plating, stamping, cutting and bending in sequence.

Next, according to the procedure illustrated in FIG. 9, the mould 4 having the fixing means as illustrated in FIG. 10 is prepared in advance (step S1), then the first metal plate 21 and the second metal plate 22 manufactured as above are inserted and fixed into the mould 4 (step S2), and then the plastic composition 3 is added to execute insert moulding in the one illustrated in FIG. 10 (step S3) so as to form the heat dissipating frame structure 1 as illustrated in FIG. 1.

According to an exemplary embodiment of the present disclosure, as illustrated in FIGS. 9A and 9B, the fixing means is erecting a plurality of fixed columns 41 in the mould 4 in concern with the metal plate assembly 2 so as to prevent the deformations and displacements of the metal plate assembly, causing the heat conduction inequality and the decrease of the heat dissipation efficiency, caused by the excessive pressure during the insert moulding. However, the fixing means according to the present disclosure is not limited to erect the fixed columns and various methods can be applied so long as the above effects can be achieved.

Further, according to an exemplary embodiment of the present disclosure, with respect to the first metal plate 21, the connecting holes H of the overlapped portions are inserted with rivets for fixation so that the fixation can be convenient and fast, and it is insusceptible to the deformations due to the excessive pressure during the insert moulding. However, the formation of the surrounding portion 212 of the first metal plate 21 can be achieved by various methods as long as the above effects can be achieved.

For example, it can be designed to be formed integrally. In this way, any fixation such as the application of the rivets as mentioned above can be omitted so that receiving the heat can be faster and more uniform.

Moreover, according to an exemplary embodiment of the present disclosure, regarding the necessary of the hardness being harder than the plastic composition and the precision of the end product, it is preferred to use steel mould as the mould 4. However, other materials for the mould can be applied as long as the above effects can be achieved.

After forming the heat dissipating frame structure 1 as mentioned above, returning to FIG. 5, the in-plane direction of the part 221 of the second metal plate 22 connecting with the heating elements such as LED dies is parallel to the in-plane direction of the part 211 of the first metal plate 21 contacting with the heating elements such as LED dies, and the second electrode portion 222 of the second metal plate 22 is surrounded by the surrounding portion 212 of the first metal plate 21.

Accordingly, the second metal plate 22 can be for example served as the plug of the external power supply during the product application and at the same time assist in conducting the heat generated from the heating element rapidly to the plastic composition. Certainly, the shape of the second metal plate 22 can be changed and various parts can be added as appropriated to provide more functions.

Figure 11:
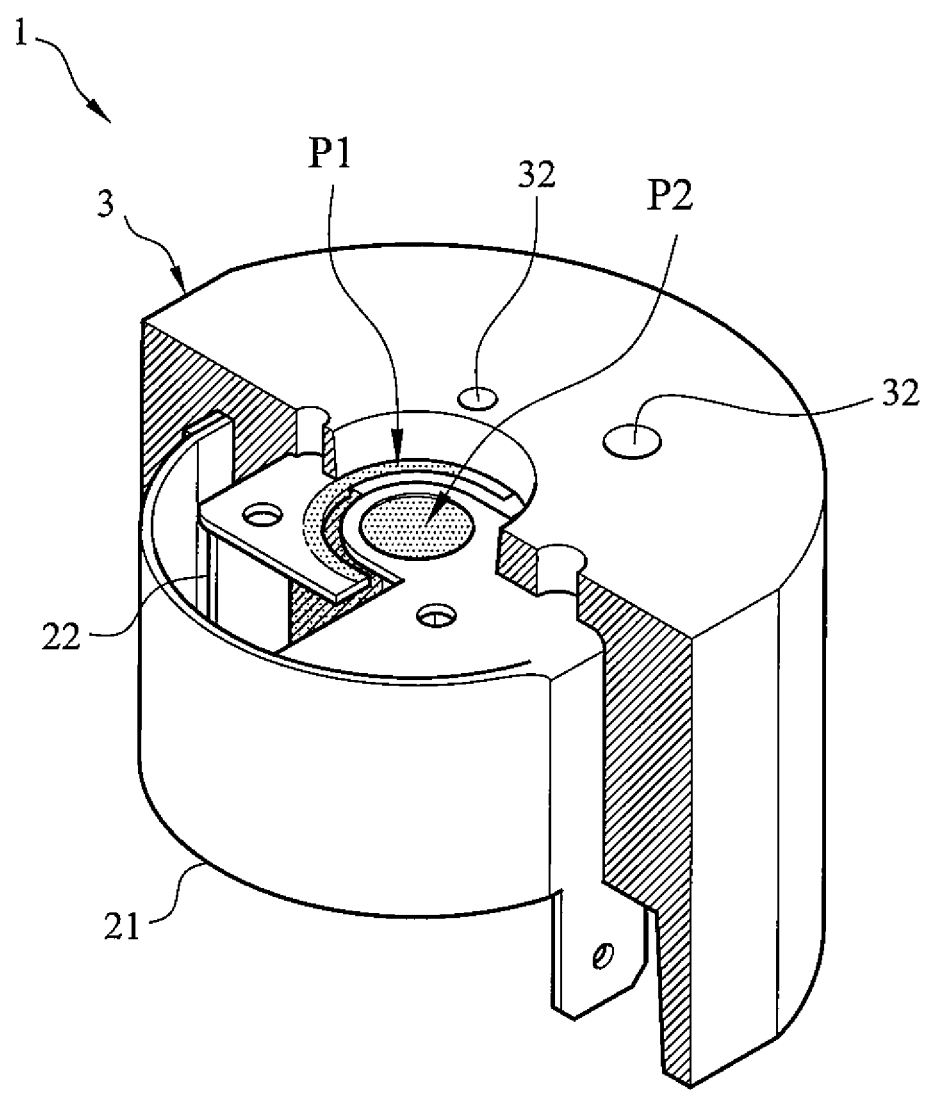
FIG. 11 is a schematic view illustrating a combination of a plastic composition and a metal plate assembly according to an exemplary embodiment of the present disclosure.

FIG. 11 is a schematic view illustrating the combination of the plastic composition and the metal plate assembly according to an exemplary embodiment of the present disclosure.

As illustrated in FIG. 11, the heat dissipating frame structure 1 is formed in the aforementioned manner so that the metal plate assembly 2 can be seamlessly combined with the plastic composition 3 and the heat generated from the heating elements such as LED dies can be conducted through the metal plate assembly 2 to the plastic composition 3 rapidly increasing the heat dissipation efficiency.

In general, when heat conduction or dissipation is required, in order to make two substances contacting with each other and increase the contact area therebetween to achieve the best effect of thermal conduction, mediums such as thermal paste or thermal pads are used. However, whatever is used, the heat is conducted through medium after all so that the effect of complete contact cannot be achieved. Therefore, regarding the heat dissipating frame structure 1 according to an exemplary embodiment of the present disclosure, the metal plate assembly 2 and the plastic composition 3 completely contact with each other without any medium by insert moulding so that the effect of thermal conduction can be exerted to the maximum; accordingly, the thermal energy generated from the working of for example high power light emitting diodes can be effectively and rapidly exported so that the performance can be better, the life can be longer, the size can be smaller and thus the breadth of the applications can be enhanced and therefore the ease of use is increased.

Further, after the heat dissipating frame structure 1 is formed as mentioned above, the metal plate assembly 2 can provide the heating elements such as LED dies for example the place P1 for direct placement and the place P2 for wire bonding respectively by different metal plates, that is, the first metal plate 21 and second metal plate 22. Further, as illustrated in FIGS. 1 and 11, after the heat dissipating frame structure 1 is formed as mentioned above, the plastic composition 3 partially covers the metal plate assembly 2 so that the top surface of the metal plate assembly 2 is exposed for directly contacting with heating elements such as LED dies to conduct rapidly the heat generated from the heating elements such as LED dies to the whole metal plate assembly 2.

According to the above exemplary embodiment of the present disclosure, a dissipating frame structure and a fabricating method thereof can be provided, in which the thermal energy generated from the working of heating elements such as high power light emitting diodes is effectively and rapidly exported so that the performance can be better, the life can be longer, the size can be smaller and thus the breadth of the applications can be enhanced and therefore the ease of use is increased.

Above, the present disclosure is specifically described according to the above embodiment; however, the present disclosure can be modified or changed variously without departing from the scope and the spirit of the invention and is not limited to the above embodiment.

What is claimed is:

1. A heat dissipating frame structure comprising:
    a metal plate assembly, a part of which is contacting with a heating element; and
    a plastic composition combined with said metal plate assembly to through said metal plate assembly receive the heat generated from said heating element;
    wherein said metal plate assembly includes a first metal plate partially contacting with said heating element and a second metal plate connecting with said heating element,
    said first metal plate defines a long side direction along its length and a short side direction along its width and being folded as to include a part contacting with said heating element, a surrounding portion and a first electrode portion,
    said surrounding portion:
        configured from a fold of the first metal plate along the short side direction,
        forms a complete circle viewing from the short direction, and
        includes two terminal ends that are overlapped relative to each other, said two terminal ends being fixed to each other.

2. The heat dissipating frame structure according to claim 1, wherein
    said second metal plate is L shaped and includes second electrode portion and a part perpendicular to said second electrode portion and being connected with said heating element,
    the in-plane direction of the part of said second metal plate connecting with said heating element is parallel to the in-plane direction of the part of said first metal plate contacting with said heating element,
    said second electrode portion of said second metal plate is surrounded by said surrounding portion of said first metal plate.

3. The heat dissipating frame structure according to claim 1, wherein said plastic composition is formed to include fixing grooves.

4. The heat dissipating frame structure according to claim 1, wherein said plastic composition is formed to include fixing holes.

5. A method for fabricating the heat dissipating frame structure according to claim 1, comprising:
    combining the metal plate assembly and the plastic composition by insert moulding.

6. The method for fabricating the heat dissipating frame structure according to claim 5, further comprising:
    fixing the first metal plate and the second metal plate in a mould including fixing means before executing the insert moulding.

* * * * *